(12) United States Patent
Thiel et al.

(10) Patent No.: US 6,437,421 B1
(45) Date of Patent: Aug. 20, 2002

(54) SELF-ALIGNED DUAL-BASE SEMICONDUCTOR PROCESS AND STRUCTURE INCORPORATING MULTIPLE BIPOLAR DEVICE TYPES

(75) Inventors: Frank L. Thiel, Austin; William E. Moore, Round Rock, both of TX (US); Philip S. Shiota, Sonoma, CA (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/573,146

(22) Filed: May 17, 2000

Related U.S. Application Data

(60) Provisional application No. 60/168,695, filed on Dec. 3, 1999.

(51) Int. Cl.$^7$ ............................................. H01L 27/082
(52) U.S. Cl. ............... 257/592; 257/575; 257/577; 257/586; 257/578; 438/313; 438/322
(58) Field of Search ................................ 257/575, 577, 257/578, 586, 592, 47, 350, 477, 542, 543, 564, 572, 581, 565, 566, 593; 438/313, 322, 329, 336, 350, 340

(56) References Cited

U.S. PATENT DOCUMENTS

| | | | |
|---|---|---|---|
| 4,239,558 A | * 12/1980 | Morishita et al. | ........... 148/175 |
| 4,261,765 A | * 4/1981 | Komatsu et al. | ............. 148/1.5 |
| 5,163,178 A | 11/1992 | Gomi et al. | ................. 257/558 |
| 5,455,188 A | 10/1995 | Yang | ............................. 437/32 |
| 5,569,612 A | * 10/1996 | Frisina et al. | .................. 437/31 |
| 5,717,241 A | 2/1998 | Malhi et al. | ................. 257/378 |

* cited by examiner

Primary Examiner—Tom Thomas
Assistant Examiner—Donghee Kang
(74) Attorney, Agent, or Firm—Zagorin, O'Brien & Graham, LLP

(57) ABSTRACT

A semiconductor process is disclosed which forms openings in a dielectric layer through which the base region of both high-voltage and high-gain bipolar transistors are formed. In one embodiment of the invention, the openings for the high-gain transistors are first protected by a photoresist layer that is patterned to expose the openings for the high-voltage transistors. A first base implant is performed through the exposed windows in the dielectric layer and into the exposed substrate or epitaxial layer therebelow, and then diffused to a suitable depth. The patterned photoresist is then removed to additionally expose the openings for the high-gain devices, and a second base implant is performed, this time into both base regions, and then diffused to a suitable depth. Emitter regions are then formed within the base regions of both transistor types by traditional implantation and contact techniques. Since the two base implants for each high-voltage transistor are self-aligned to a single opening through the dielectric layer, excellent control and repeatability is achieved for the high-voltage transistors. Moreover, since the second base implant is common to both types of transistors, many of the characteristics of the two types of transistors are well matched to each other.

17 Claims, 7 Drawing Sheets

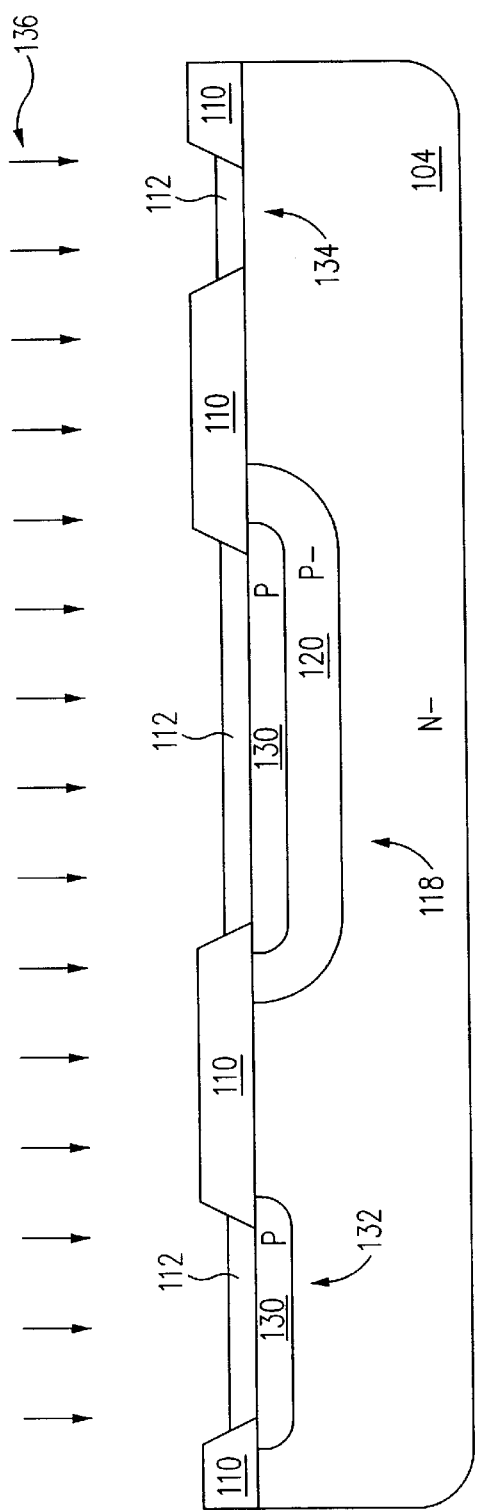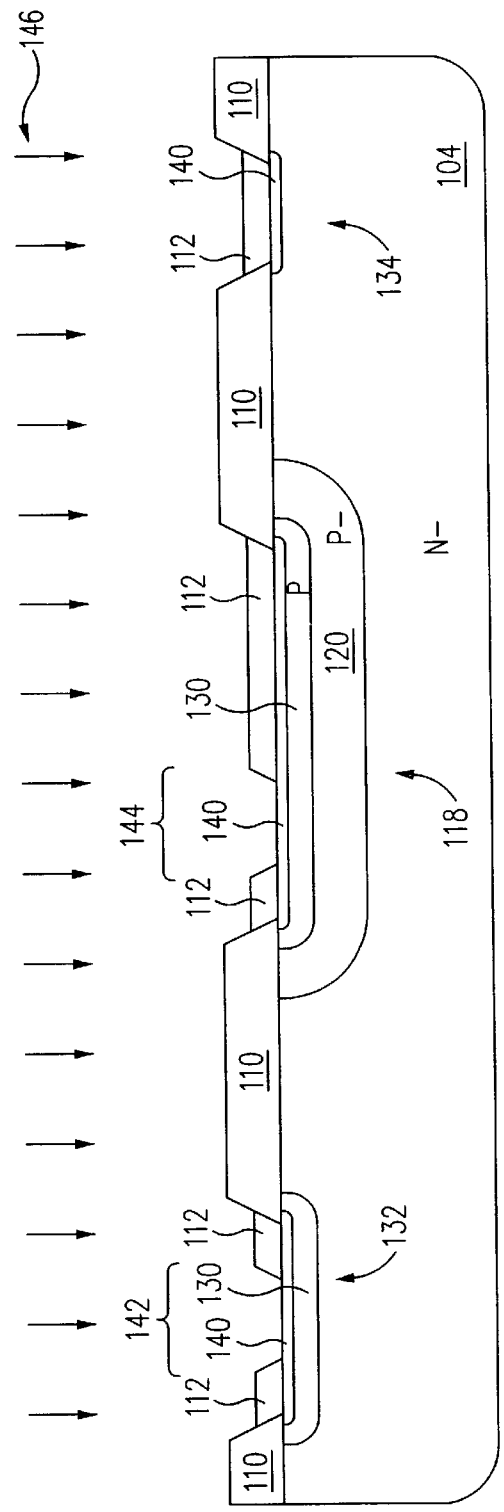
FIG. 1D
FIG. 1E

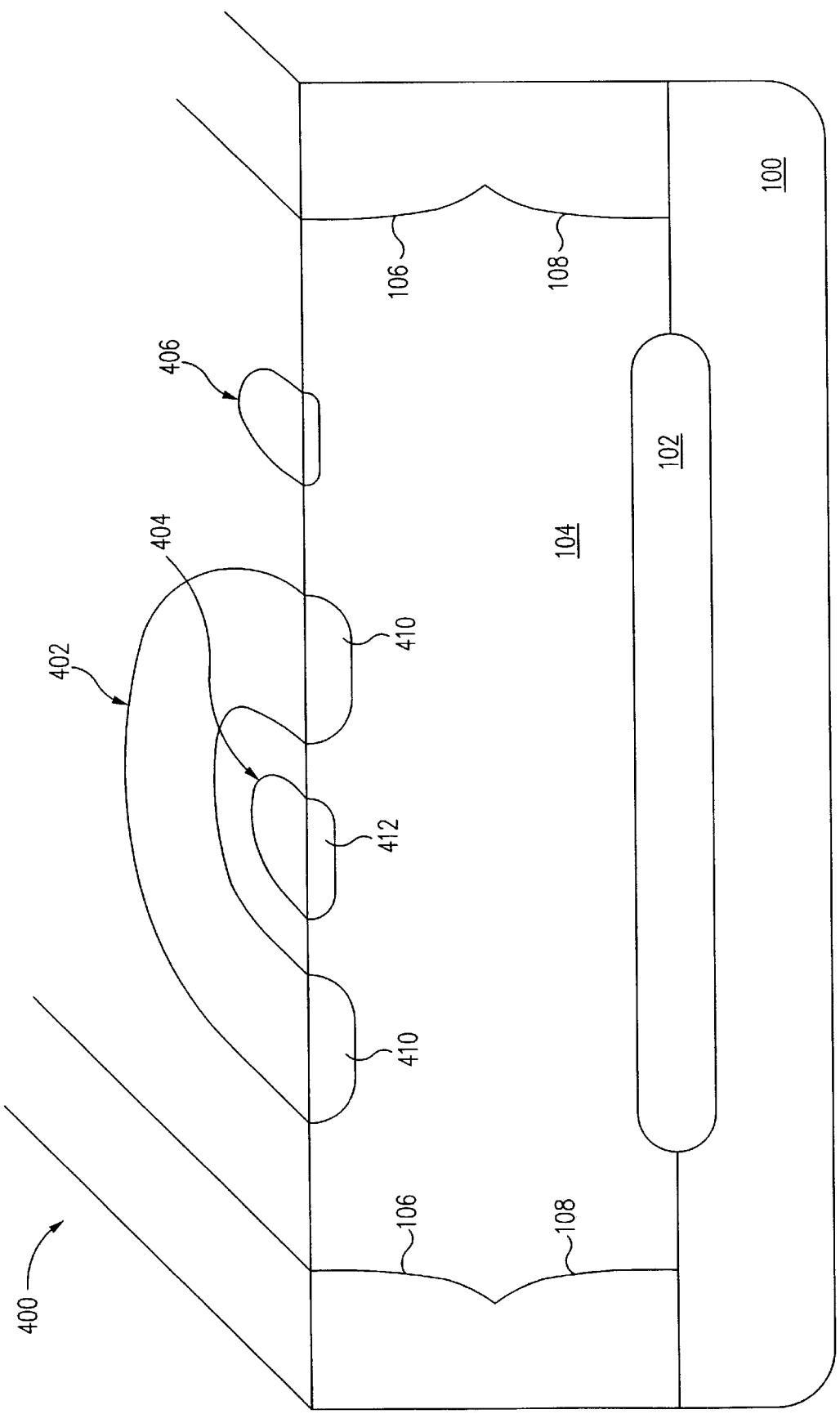

SELF-ALIGNED DUAL-BASE SEMICONDUCTOR PROCESS AND STRUCTURE INCORPORATING MULTIPLE BIPOLAR DEVICE TYPES

CROSS REFERENCE TO RELATED APPLICATIONS

This application claims the benefit of U.S. Provisional Application No. 60/168,695, filed Dec. 3, 1999, which is incorporated herein by reference in its entirety.

BACKGROUND OF THE INVENTION

1. Field of the Invention

The present invention relates to semiconductor processes for fabricating bipolar junction transistors, and more particularly to those processes for creating self-aligned, dual-base bipolar junction transistors and other bipolar junction transistor types on the same integrated circuit.

2. Description of the Related Art

The fabrication of self-aligned bipolar transistors is well known. To fabricate such a device, a single opening is usually cut through an oxide overlying an epitaxial layer, and multiple base implants (e.g., one deep and one shallow) are performed through the same opening. While such bipolar devices are well known, they are usually optimized for low voltage, high performance use, and all the bipolar junction transistors on the same integrated circuit (IC) usually are processed identically.

However, many attractive markets exist which require an integrated circuit to tolerate rather high voltages (e.g., 100–150 volts), and yet require the integrated circuit to be relatively high in performance. For example, subscriber circuits for telecommunications applications must withstand the ringing voltage associated with legacy telephone local loops, but are looked upon to support increasingly faster data rates as digital transmission techniques become more and more pervasive. Consequently, a simple, cost-effective semiconductor process is desired which provides high-voltage bipolar transistors having a high collector-to-emitter breakdown voltage and other bipolar transistors having a high forward gain.

SUMMARY OF THE INVENTION

A semiconductor process is disclosed which forms openings in a dielectric layer through which are formed features of two transistor types. In one embodiment of the invention in which both high-voltage and high-gain bipolar transistors are formed on the same integrated circuit, the openings for the high-gain transistors are first protected by a photoresist layer that is patterned to expose the openings for the high-voltage transistors. A first base implant is performed through the exposed windows in the dielectric layer and into the exposed substrate or epitaxial layer therebelow, the patterned photoresist is removed and then the implant is diffused to a suitable depth. By removing the patterned photoresist, additional openings are exposed for the high-gain devices, and a second base implant is performed, this time into both base regions, and then diffused to a suitable depth. Emitter regions are then formed within the base regions of both transistor types by traditional implantation and contact techniques. Since the two base implants for each high-voltage transistor are self-aligned to a single opening through the dielectric layer, excellent control and repeatability is achieved for the high-voltage transistors. Moreover, since the second base implant is common to both types of transistors, many of the characteristics of the two types of transistors are well matched to each other.

The characteristics of the deep base preferably provide a less steep junction with a larger radius of curvature to raise the junction breakdown voltage and therefore the $BV_{CEO}$ of the high-voltage bipolar junction transistors. The shallow base may be optimized for forward DC current gain (Beta) of the high gain bipolar junction transistor. Since the shallow implant is also performed into the high-voltage device, the gain of the high-voltage device is affected as well, thus improving the matching between the two transistor types. Advantageously, a single hard oxide mask controls the critical dimensions (CD's) for both transistor types, and requires only loose CD and alignment control of the selective (i.e., $1^{st}$) base mask. The advantages of two bipolar junction transistor types are gained, yet require only the addition of a single, non-critical mask patterned only in photoresist. Additional masking steps may be used to selectively perform other diffusions or implants or to selectively mask the second base implant to create additional devices such as, for example, resistors.

In one embodiment of the invention suitable for a semiconductor fabrication process, a method for forming both first and second vertical bipolar junction transistor types includes providing a semiconductor substrate having a first polarity, forming a first dielectric layer upon the substrate, forming first and second pluralities of openings through the first dielectric layer respectively corresponding to the first and second transistor types, introducing a first dopant of a second polarity opposite that of the first polarity through the first plurality of openings to form a first doped layer within the semiconductor substrate therebelow while protecting the second plurality of openings, and introducing a second dopant of the second polarity through the second plurality of openings to form a second doped layer within the semiconductor substrate therebelow.

A semiconductor integrated circuit structure embodiment of the invention includes first and second vertical bipolar junction transistor types. The structure includes a semiconductor substrate of a first polarity having a top surface, and a first dielectric layer upon the top surface of the substrate, having first and second pluralities of openings therethrough respectively corresponding to the first and second transistor types. The structure further includes a first plurality of doped layers at the top surface of and within the substrate, each comprising a first dopant of a second polarity opposite that of the first polarity, each formed generally below and substantially aligned to a respective one of both the first and second plurality of openings within the first dielectric layer. The structure still further includes a second plurality of doped layers at the top surface of and within the substrate, each comprising a second dopant of the second polarity, each formed generally below and substantially aligned to a respective one of the second plurality of openings within the first dielectric layer.

Another semiconductor integrated circuit structure embodiment of the invention includes first and second vertical bipolar junction transistor types. The structure includes a semiconductor substrate of a first polarity having a top surface, respective isolated regions of the substrate forming respective collector nodes for the first and second vertical bipolar junction transistor types. The structure further includes a first base region formed within the substrate and substantially aligned to a first opening through a first dielectric layer overlying the first base region, the first base region corresponding to the first vertical bipolar junction transistor type and comprising a first doping profile of a second polarity opposite the first polarity. The structure still further includes a second base region formed within the substrate and substantially aligned to a second opening through the first dielectric layer overlying the second base region, the second base region corresponding to the second vertical bipolar junction transistor type and comprising a second doping profile of the second polarity.

In yet another embodiment of the present invention, a semiconductor integrated circuit structure includes a semiconductor substrate of a first polarity having a top surface, respective isolated regions of the substrate forming respective collector nodes for the first and second vertical bipolar junction transistor types. The structure includes a first base region formed within the substrate and substantially aligned to a first opening through a first dielectric layer overlying the first base region, the first base region corresponding to the first vertical bipolar junction transistor type and comprising a first doping profile of a second polarity opposite the first polarity. The structure further includes a second base region formed within the substrate and substantially aligned to a second opening through the first dielectric layer overlying the second base region, the second base region corresponding to the second vertical bipolar junction transistor type and comprising both the first doping profile and a second doping profile of the second polarity, both substantially aligned to the second opening through the first dielectric layer. The structure still further includes a first emitter region formed within the first base region at the surface of the substrate, the first emitter region comprising a third doping profile of the first polarity, and a second emitter region formed within the second base region at the surface of the substrate, the second emitter region comprising the third doping profile, wherein the first doping profile has a depth which is substantially greater than that of the second doping profile.

The present invention may be better understood, and its numerous features and advantages made even more apparent to those skilled in the art by referencing the detailed description and accompanying drawings of the embodiments described below. These and other embodiments of the present invention are defined by the claims appended hereto.

BRIEF DESCRIPTION OF THE DRAWINGS

The present invention may be better understood, and its numerous objects, features, and advantages made apparent to those skilled in the art by referencing the accompanying drawings.

FIGS. 1A–1G illustrate a semiconductor process flow in accordance with an exemplary embodiment of the present invention.

FIG. 4 is a combination cross-section and top view of another embodiment of a lateral PNP transistor structure.

The use of the same reference symbols in different drawings indicates similar or identical items.

DETAILED DESCRIPTION

Figure 1A:
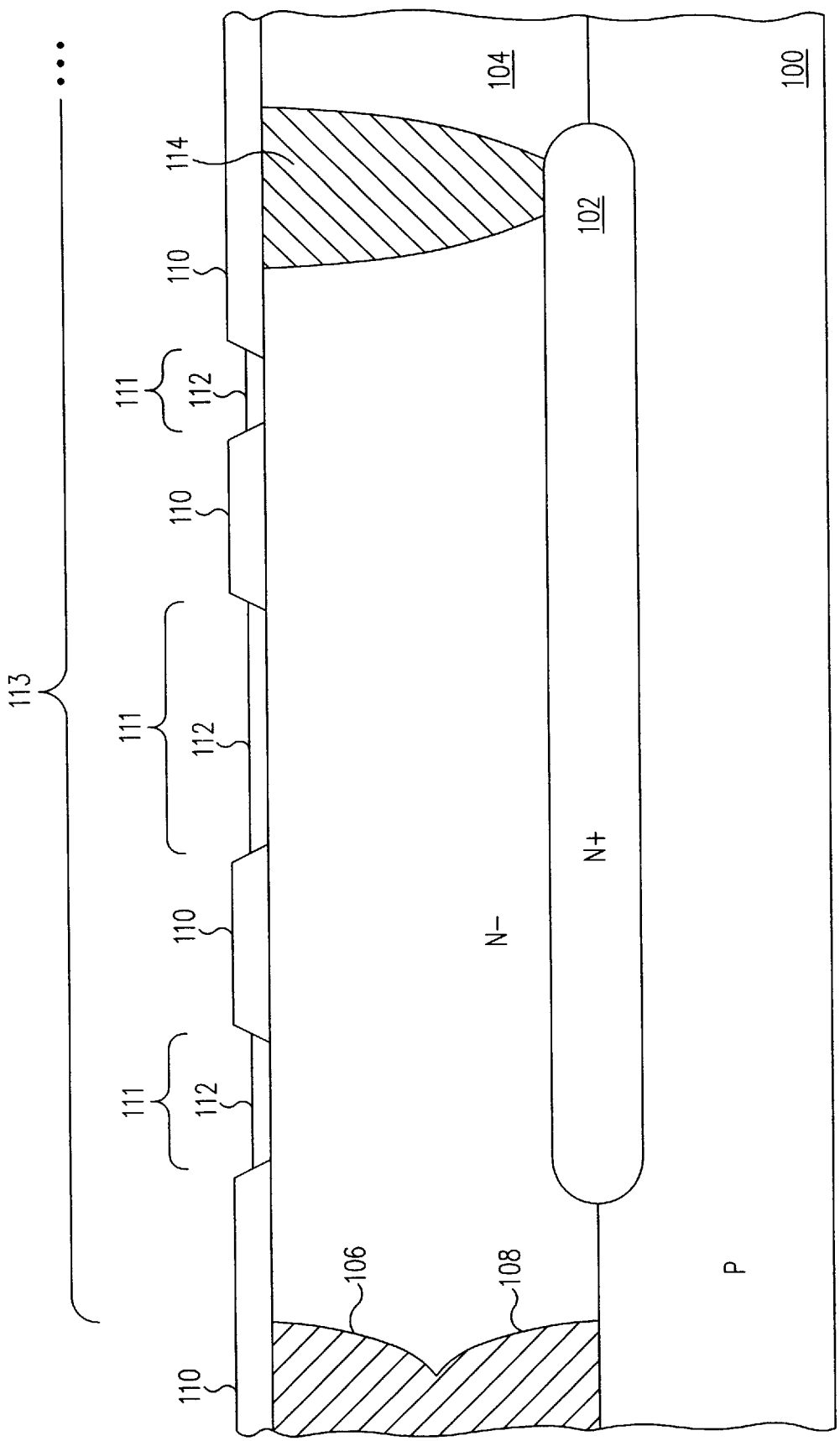

In one embodiment of the present invention, high-voltage bipolar junction transistors, high gain bipolar junction transistors, and implanted resistors are formed on the same integrated circuit. Referring now to FIG. 1A, a lightly-doped N-type epitaxial layer 104 is formed using traditional techniques upon a P-type semiconductor substrate 100. The epitaxial layer 104 is preferably doped to achieve a 15 Ωcm resistivity and formed 28μ thick. An N+ buried collector 102, a "sinker" 114 to contact the buried collector 102, and double-diffused P-type junction isolation regions 106, 108 are also formed traditionally, as is well known in the art. In forming these structures, the epitaxial layer 104 is oxidized during various steps to form an oxide layer on the surface of the epitaxial layer 104. These steps, as well as an additional oxidation step combine to grow a relatively thick "field" oxide layer 110 which is preferably about 10 kÅ thick. As is described below, this field oxide 110 must be thick enough to block subsequent high energy boron implants which selectively form base regions of the bipolar junction transistors.

The oxide layer 110 is patterned (using traditional lithography) and etched (using traditional oxide etchants and etching techniques) to form openings 111 through the field oxide layer 110 that correspond to various devices to be formed as described below. Then, a thermal oxidation is performed to grow a composite oxide layer 112 approximately 4 kÅ thick within the openings 111 previously cut through the field oxide layer 110. FIG. 1A reflects the process carried up through these steps, and shows three separate openings 111 through the field oxide layer 110 within the same "tank" 113 (i.e., a region of the epitaxial layer 104 bounded by junction isolation regions, such as 106, 108 shown on the left of the figure, and other junction isolation regions not shown). A buried collector sinker 114 is also shown within the same tank 113 extending from the surface of the epitaxial layer 104 down to the buried collector 102.

The composite oxide layer 112 is so-termed because it represents the composite layout of: (1) the base region for the high-voltage transistor; (2) the base region for the high gain transistor; and (3) the implanted resistor region. Three different implants may selectively be performed through this composite oxide 114: a deep base boron implant, a shallow base boron implant, and a shallow resistor boron implant. The composite oxide layer 112 functions as an implant screen to limit channeling during these implant steps (which gives tighter control, although here the dopant is later driven-in to such a depth that such concerns are less important than when forming shallow junctions). The composite oxide layer 112 also is used as a capacitor dielectric layer for other useful structures (not shown). Also, by growing the composite oxide layer 112 before boron is implanted into the epitaxial layer 104, and subsequently avoiding oxidizing ambients, there is less segregation of boron into the oxide layer 112 than would otherwise occur if such an oxide were grown after the boron implants.

Figure 1B:
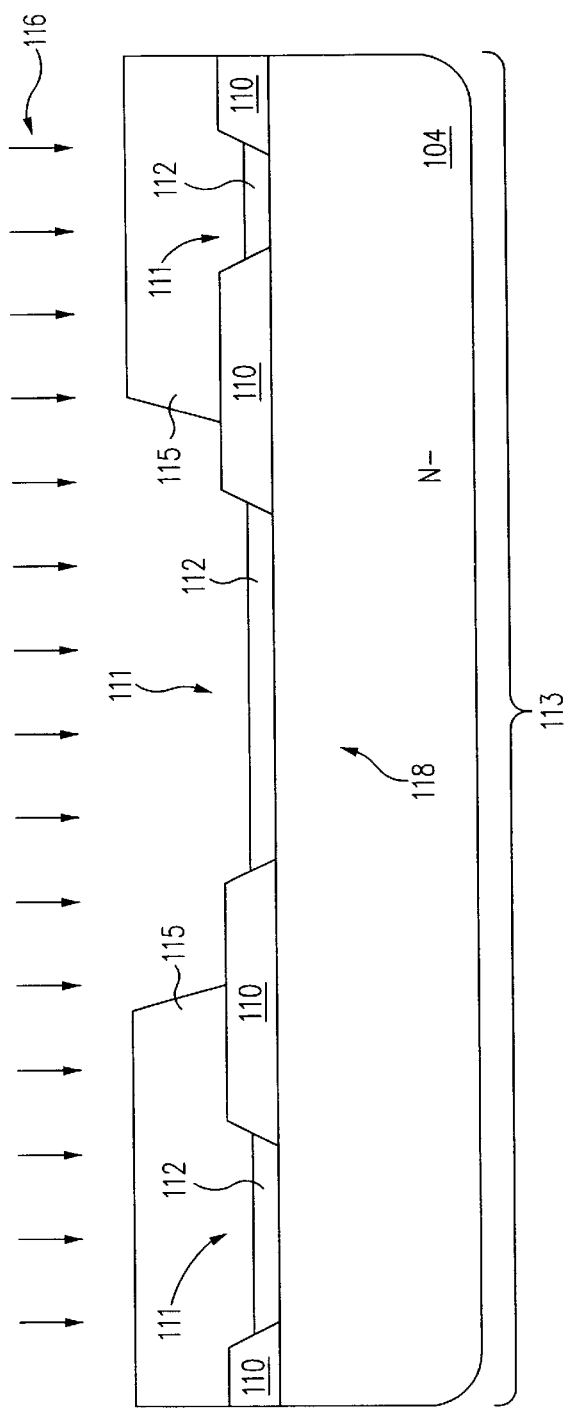

Continuing on with the process flow, a photoresist layer is applied, patterned and etched to expose the openings in the oxide layer 110 (and the composite oxide layer 112 therewithin) corresponding to the base region of the high-voltage transistors. Referring now to FIG. 1B, a portion of the tank 113 is shown which includes the three separate openings 111 through the oxide layer 110 described above. An opening in the photoresist layer 115 is shown having been formed above a region 118 where a high-voltage transistor base region is to be formed. The other two openings 111 remain covered by the photoresist layer 115, which forms an implant mask. Next, a deep base implant 116 is performed which is preferably a singly-ionized boron implant (B+) performed at an energy of 160 keV and a dose of $2.6 \times 10^{13}$ atoms/cm$^2$ (i.e., 2.6E13). Since the oxide layer 110 is itself thick enough to block substantially all of the implant from reaching the epitaxial layer 104, the critical dimension tolerance (i.e., CD tolerance) and alignment tolerance of the photomask used to pattern the photoresist layer 115, as well as the etching control of the photoresist layer 115, are non-critical. The oxide layer 110 functions as a "hard mask" for the boron implant, and the photoresist layer 115 need only selectively control which openings through the oxide layer 110 are actually exposed to the boron implant, rather than having to control the exact extent of the boron implant. The photoresist layer 115 is then removed, and a long anneal is performed, preferably in a diffusion tube under an inert $N_2$ ambient at 1230° C. for 169 minutes, to diffuse the implanted boron atoms to a desired temporal junction depth (i.e., the junction depth at this point in the process flow) approximately 4–5$\mu$ into the epitaxial layer 104. With subsequent processing (described below), the implanted boron atoms are further diffused to achieve a desired final junction depth approximately 6–7$\mu$ into the epitaxial layer 104.

Figure 1C:
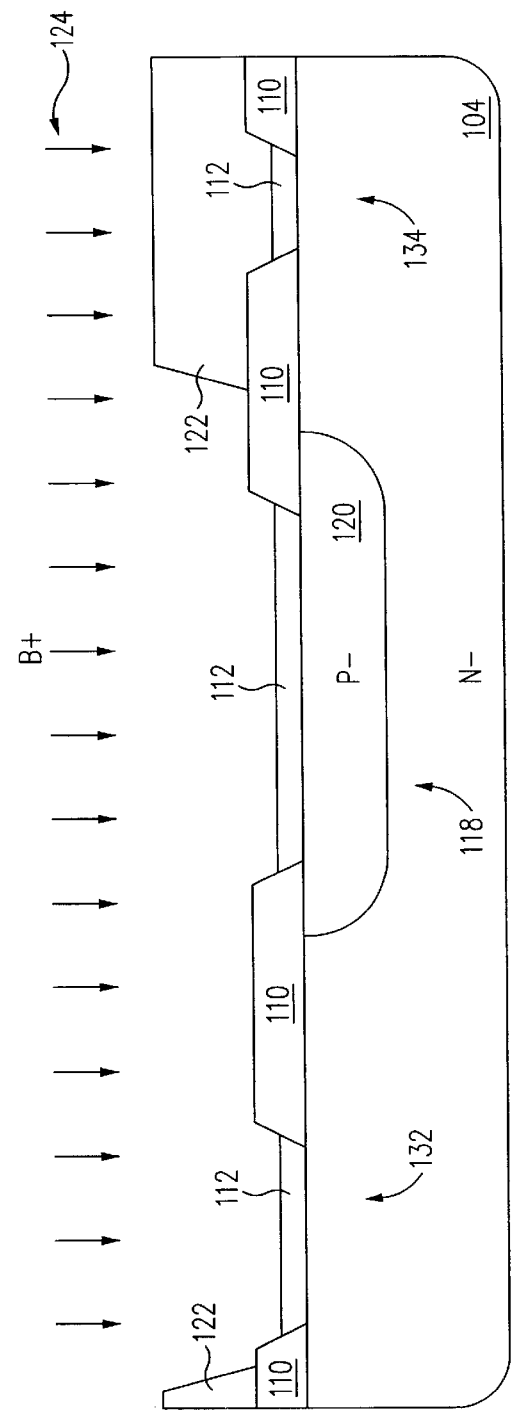

The resulting structure is shown in FIG. 1C. A deep base region 120 is shown having been formed within the epitaxial layer 104 in the region 118 corresponding to the location of the high-voltage transistor. Continuing on with the process flow, a photoresist layer 122 is applied, patterned and etched to expose the openings in the oxide layer 110 (and the composite oxide layer 112 therewithin) corresponding to the base region of both the high gain transistor (region 132) and the high-voltage transistor (region 118). The other opening 111 (region 134) remains covered by the photoresist layer 122, which again forms an implant mask. Next, a shallow base implant 124 is performed which is preferably a singly-ionized boron implant (B+) performed at an energy of 160 keV and a dose of $9.5 \times 10^{13}$ atoms/cm² (i.e., 9.5E13). As before, the oxide layer 110 functions as a "hard mask" for the boron implant, and the critical dimension, alignment, and etching tolerances of the photoresist layer 122 are non-critical because it need only selectively control which openings through the oxide layer 110 are actually exposed to the boron implant, rather than having to control the exact extent of the boron implant. The photoresist layer 122 is then removed, and a long anneal is performed, preferably in a diffusion tube under an inert $N_2$ ambient at 1200° C. for 50 minutes, to diffuse the implanted boron atoms (implant 124) to a desired temporal junction depth approximately 2–3$\mu$ into the epitaxial layer 104. With subsequent processing (described below), these implanted boron atoms are further diffused to achieve a desired final junction depth approximately 3.5$\mu$ into the epitaxial layer 104.

The resulting structure is shown in FIG. ID. A shallow base region 130 is shown having been formed within the epitaxial layer 104 in the region 132 corresponding to the location of the high-gain transistor. A shallow base region 130 is also shown having been formed within the epitaxial layer 104 in the region 118 corresponding to the location of the high-voltage transistor. Continuing on with the process flow, an unmasked (i.e., "blanket") implant 136 is performed to form resistors and to additionally dope the surface of the transistor base regions with a low concentration boron implant to form a surface charge control layer (described below). This resistor implant 136 is preferably a singly-ionized boron implant (B+) performed at an energy of 160 keV and a dose of $4.5 \times 10^{13}$ atoms/cm² (i.e., 4.5E13). The oxide layer 110 again functions as a "hard mask" for the boron implant, preventing the boron from reaching the epitaxial layer 104 except through the openings 111. Of course, this implant could alternatively be a masked implant using, for example, a patterned photoresist layer to prevent the implant from reaching certain areas of the semiconductor device structure. No drive-in or anneal of the resistor implant 136 is performed at this time, but rather is preferably performed later when the emitter implant is driven-in (as described below).

Continuing on with the process flow, a photoresist layer is applied (not shown) and an emitter mask (not shown) is used to define and etch openings 142 and 144 in the composite oxide layer 112 for forming emitters for the two types of bipolar junction transistors. The emitter mask is also used to make openings through the oxide layer 110 for contacting the buried collector sinkers (not shown here) as is well known. Since the sinker contact windows (i.e., the buried collector contacts) etch through about 10 kÅ oxide, and the emitter windows within the transistor base regions only etch through 4 kÅ oxide (and results in an overetch) the emitter features are sized smaller than the collector contacts, but both end up about the same size of, for example, nominally 4$\mu$ for the minimal size emitter (for good injection efficiency). The resulting structure is shown in FIG. 1E (again, without showing the patterned photoresist masking layer). A shallow resistor layer 140 is shown having been formed near the surface of the epitaxial layer 104 in the region 134 corresponding to the location of the resistor. A P-type resistor layer 140 is also shown having been formed within and near the surface of the base of the high-gain transistor (within region 132) and within and near the surface of the base region of the high-voltage transistor (within region 118). An opening 142 is shown in the composite oxide layer 112 in region 132 for the emitter of the high gain transistor, and within region 118 for the emitter of the high-voltage transistor.

The shallow resistor implant 136 is used, of course, to form resistors, but it also helps the characteristics of the bipolar junction transistors. In particular, a heavier P+ doping is achieved on the surface of the base region due to the presence of the resistor layer 140, which raises the built in voltage (i.e., $V_{BI}$) of the base/emitter junction near its surface. The electrical performance of the bipolar junction transistors which this helps achieve are described later.

Continuing with the process flow, the emitter implant 146 is then performed to form emitter regions within the transistor base regions and to form contacts to the transistor buried collector sinkers. This emitter implant 146 is preferably a singly-ionized phosphorus implant (P–) performed into bare silicon at an energy of 60 keV and a dose of $2.0 \times 10^{16}$ atoms/cm². Both the oxide layer 110 and the remaining portions of the composite oxide layer 112 function as a "hard mask" for this phosphorus implant, preventing the phosphorus from reaching the epitaxial layer 104 except through the openings 142, 144. Alternatively, the photoresist layer defining the emitter openings may remain on the oxide surface during this emitter implant. The wafers are sulphuric acid cleaned, followed by a hydroflouric acid dip (i.e., HF dip). Undoped polysilicon is then deposited to a preferable thickness of 3 kÅ onto the semiconductor structure using traditional techniques. The polysilicon is then doped with a standard $POCl_3$ predeposition procedure (which also activates the resistor implant and emitter implant) and then is driven to achieve a doped polysilicon resistance of 30–50$\Omega$ per square and form an ohmic contact between the polysilicon and the emitter region. The junction depth of the emitter region is also increased by this drive, which affords advantageous high voltage performance, described below. Then, a 10:1 HF dip is performed to eliminate the remaining $P_2O_5$ source glass from the surface of the polysilicon. A photoresist layer (not shown) is then applied, masked, and etched to expose regions of the polysilicon layer therebelow. The polysilicon layer is then etched using a standard chlorine plasma etch to define individual polysilicon features.

Figure 1F:
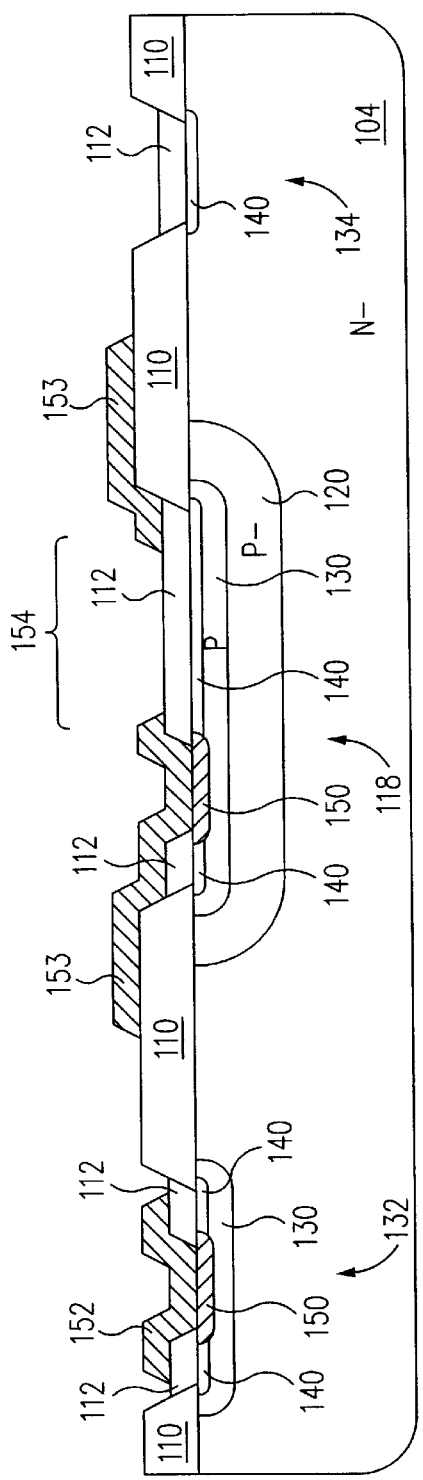

The resulting structure is shown in FIG. 1F. A first polysilicon feature 152 is shown contacting the emitter region 150 of the transistor 132 (i.e., the bipolar junction transistor formed in the region 132). The emitter region 150 extends through the resistor layer 140 because the phosphorus emitter implant is diffused through and driven to a greater depth than the light boron resistor layer implant forming the resistor layer 140. The polysilicon 152 also laps up and over the composite oxide layer 112 formed above the base region of the transistor 132, but as shown, does not necessarily extend onto the oxide layer 110. A second polysilicon feature 153 is shown contacting the emitter region 150 of the transistor 118 (i.e., the bipolar junction transistor formed within the region 118). This polysilicon feature 153 extends onto the surface of the composite oxide layer 112 as well as onto the surface of the oxide layer 110 immediately surrounding the transistor 118. An opening 154 is shown in the polysilicon feature 153 (created during the same etch operation described above which defined the polysilicon features themselves) which allows a subsequently formed contact to the underlying base region, as is described below.

Continuing with the process flow, an oxide layer is then deposited, preferably using chemical vapor deposition (CVD) to an 8 kÅ thickness, and then densified. An emitter drive-in diffusion is performed at 1000° C. for 148 minutes in a nitrogen (N$_2$) ambient in a diffusion tube, which also drives-in the resistor implant, as stated above. For this particular embodiment of the invention, the emitters are preferably formed to depth of 1.7μ. Such a depth could not be easily achieved if the emitter were doped only from the polysilicon (i.e., a polysilicon doped emitter) but is afforded by use of a separate emitter implant before polysilicon deposition. The implantation and drive-in conditions also result in about 1 kilo-ohms per square resistors (e.g., resistor 134).

Contact windows are then formed (using traditional lithography and wet etching techniques) through the various oxide layers to provide electrical contact to the base and emitter of the transistors, and to the ends of the resistors. Metal is then deposited and defined to form contacts to and interconnections between the semiconductor structures, as is traditional for such circuits, and is then protected by a passivation layer.

Figure 1G:
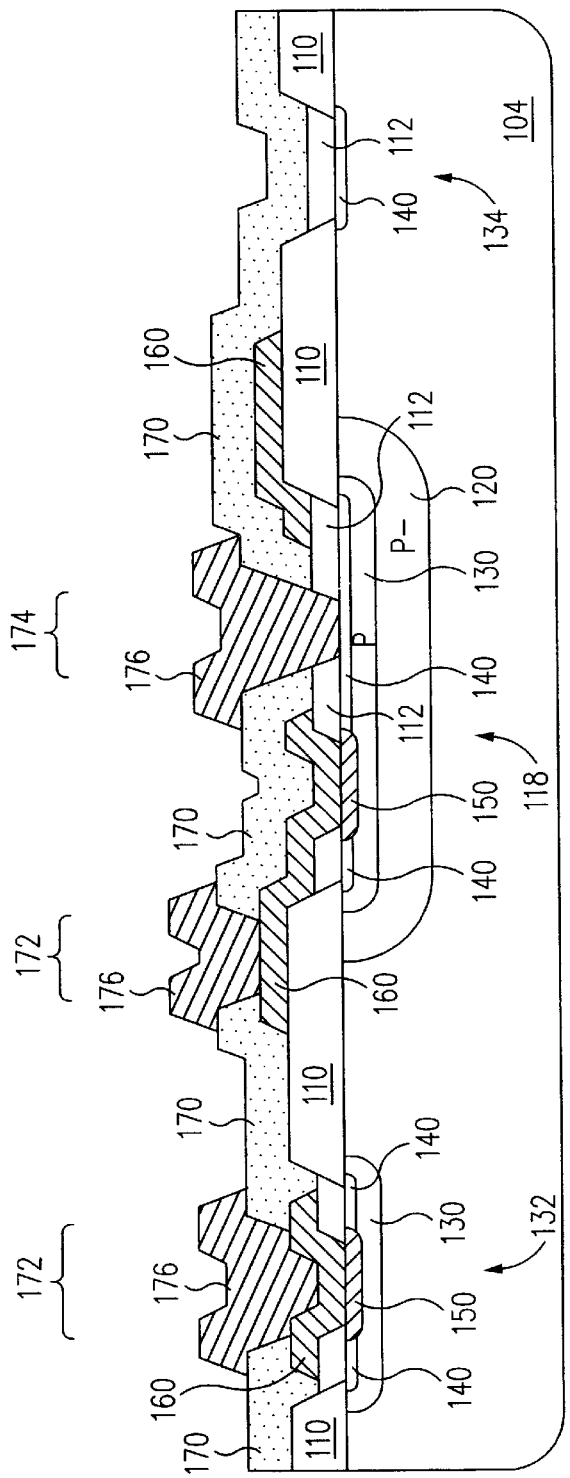

The resulting structure is shown in FIG. 1G. A densified oxide layer 170 is shown generally formed above the polysilicon features and the oxide layer 110. Three windows (i.e., contact openings) are shown through the densified oxide layer 170. Two emitter windows 172 were formed by etching through the 8 kÅ densified oxide layer 170 to provide a contact window to a respective polysilicon feature therebelow (which is already contacted to the emitter "diffusion" within the epitaxial layer 104). A base window 174 was formed by etching through the aggregate of both the 8 kÅ densified oxide layer 170 and the 4 kÅ composite oxide layer 112 to provide a contact window to a base "diffusion" therebelow (e.g., the shallow base region 130 within transistor 118). Individual metal interconnect features 176 are shown within each of these contact windows 172, 174. The passivation layer is traditionally fabricated and is not shown in FIG. 1G.

The exemplary process described thus far utilizes contacts to either a polysilicon feature or to a base region (which must include a shallow base region to provide a sufficiently high doping density near the surface of the base region to achieve an ohmic contact with the metal). Metal-to-emitter contacts are formed by way of an intermediate polysilicon feature, rather than a direct metal contact to the emitter diffusion. Metal-to-base contacts are formed directly to single-crystal silicon. Contacts to the collectors (whether or not a buried collector sinker is utilized) are formed in a similar fashion as are emitter contacts: by using an emitter implant and an intermediate polysilicon feature. The deposited metal layer is preferably an aluminum/1.0% silicon/0.5% copper alloy. The silicon within the alloy is desirable because there is no barrier layer between the metal and the polysilicon (otherwise "pitting" would result), and the copper within the alloy is desirable to enhance electromigration performance of the interconnect.

The shallow resistor implant 136 as described is used to form resistors. Alternatively, a useful high-voltage resistor may be formed by instead using the deep base implant 116, because the larger radius of curvature of the resulting deep base region 120 provides a higher breakdown voltage than does the smaller radius of curvature of the shallow resistor layer 140. The shallow base implant could be used, but the resulting resistivity value is frequently not as useful for circuit purposes as the shallower resistor implant. In the exemplary process, a metal-to-resistor contact is not made directly to either the shallow resistor layer 140 or to the deep base region 120 alone, but is made to a shallow base region 130 feature merged with each end of such a resistor. As described above, the shallow resistor implant 136 creates a resistor layer 140 within the base region of the bipolar junction transistors which functions as a P-type surface charge control layer and enhances the electrical characteristics of the transistors. In particular, a heavier P+ doping is achieved on the surface of the base region due to the presence of the resistor layer 140, which raises the built in voltage (i.e., V$_{BI}$) of the base/emitter junction near its surface. Due to the resulting decrease in surface emitter injection efficiency, this results in the transistor first turning on in an area of the base/emitter junction which is below the surface of the epitaxial layer, rather than at the surface. This reduces the Beta (i.e., β) roll-off at low collector-to-emitter currents which is associated with surface recombination by directing electrons away from the surface. The bipolar junction transistors fabricated using this exemplary process show remarkably constant Beta over six decades of current.

Bipolar junction transistors fabricated using the described process achieve a collector-to-emitter breakdown voltage (BV$_{CEO}$) of 150 volts for the high-voltage bipolar junction transistor (those having both the deep base and shallow base implants), and achieve a BV$_{CEO}$ of greater than 85 volts for the high gain bipolar junction transistor (those having only the shallow base implant). The deep base implant alone is unsuitable for constructing a bipolar junction transistor because the doping at the surface is too light.

The 150 volt BV$_{CEO}$ is achieved in part due to the polysilicon field-plate which is integrated with the emitter contact. Referring again to FIG. 1G, the polysilicon layer 160 of transistor 118 extends over the oxide layer 110 past the collector-base junction formed by the deep base implant (the interface between the deep base region 120 and the epitaxial layer 104). Since the polysilicon 153 of transistor 118 is tied to the emitter voltage, which is constrained to be always fairly similar in magnitude to the base voltage, the polysilicon emitter 160 forms a field plate structure which relaxes the electric field strength in the depletion region extending from the collector-base junction into the epitaxial layer 104 along the oxide layer 110 interface (i.e., so that the equi-potential "field lines" are more widely spaced than without the field plate structure). While certain field plate structures are well known, the disclosed field plate structure affords several advantages. It is constructed using the same features of the same layers as are used to make contact to the emitter itself: no additional layers, nor individual features or elements of already existing layers, are necessary to form the field plate structure. No metal contacts straps are used to electrically connect the field plate to a suitable voltage to accomplish its desired effect, which is particularly advantageous in processes having only one (or only a few) metal interconnect layers. It also affords additional flexibility in location of the emitter contact, which may be directly above the emitter region (e.g., transistor 132) or may be positioned laterally displaced from the emitter region and above the oxide layer 110 (e.g., transistor 118).

Figure 2:
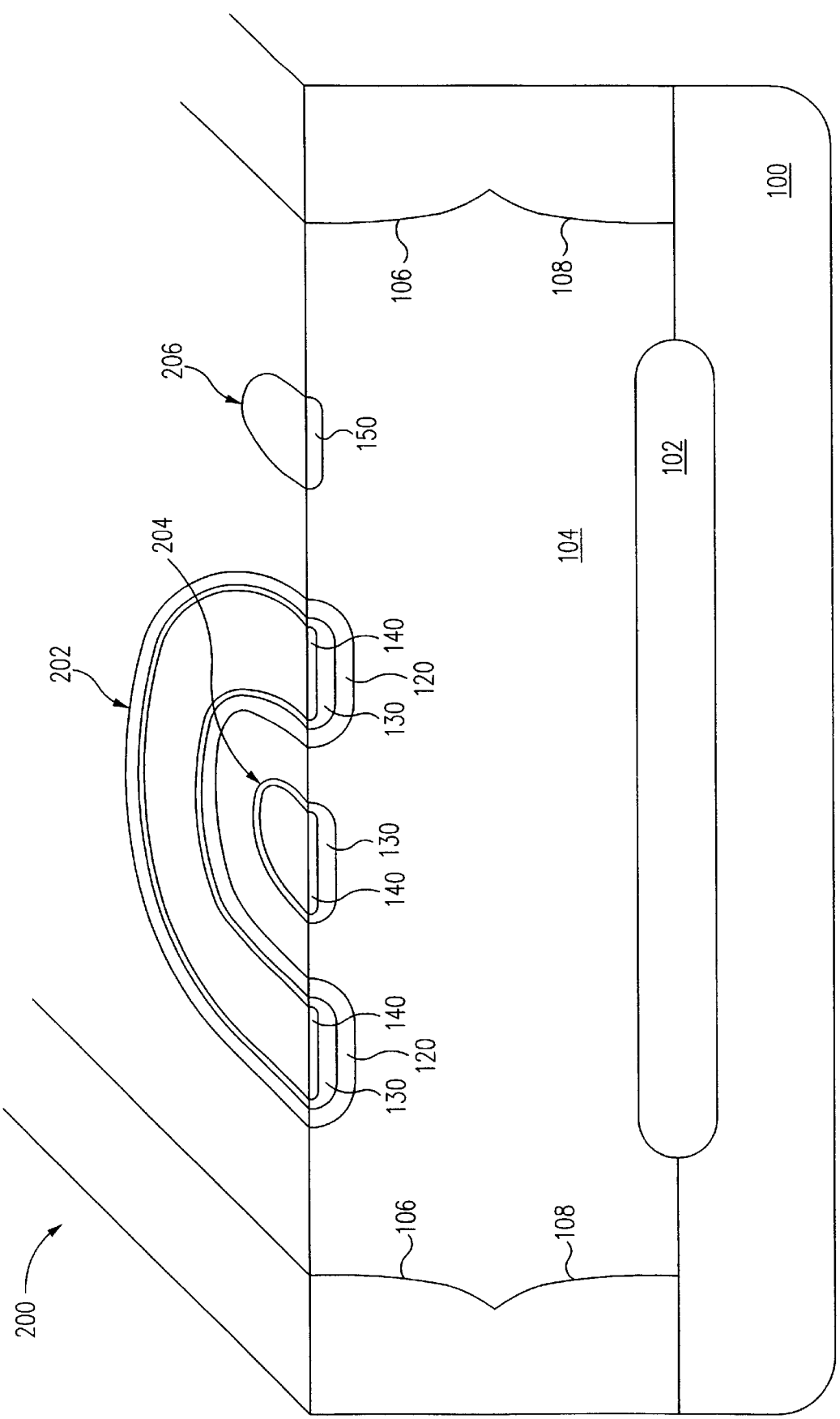
FIG. 2 is a combination cross-section and top view of a structure forming a lateral PNP transistor.

The process flow and masking sequence described above may also be used to simultaneously fabricate a well-controlled lateral PNP transistor on the same integrated circuit as the vertical NPN transistors and resistors. Referring now to FIG. 2, portions of a lateral PNP transistor 200 are shown in a combination cross-section and partial top-view. The lightly-doped N-type epitaxial layer 104 is shown formed upon the P-type semiconductor substrate 100, as before. An N+ buried collector 102 lies within the tank bounded by the double-diffused P-type junction isolation regions 106, 108 on both the left and right of the figure. A circular emitter 204 is formed using a shallow base structure (which, as described above, may include a shallow base region 130 and a resistor region 140). A circular collector 202 is formed using a deep base structure (which, as described above, may include a deep base region 120, a shallow base region 130, and a resistor region 140). A contact to the base of the lateral PNP transistor 200 (i.e., the N-type epitaxial layer 104) is afforded by forming an heavily-doped N+ diffusion layer 206 (i.e., by forming an "emitter" layer 150 as described above) within the N-type epitaxial layer 104. Metal contacts (not shown) are made directly to the circular collector 202 and the circular emitter 204 (i.e., the P-type "NPN base" regions). Metal contacts to the N+ PNP ohmic base diffusion layer 206 are formed, as above for emitter contacts, by making metal contact to a polysilicon feature which is contacted to the N+ PNP ohmic base diffusion layer 206.

Figure 3:
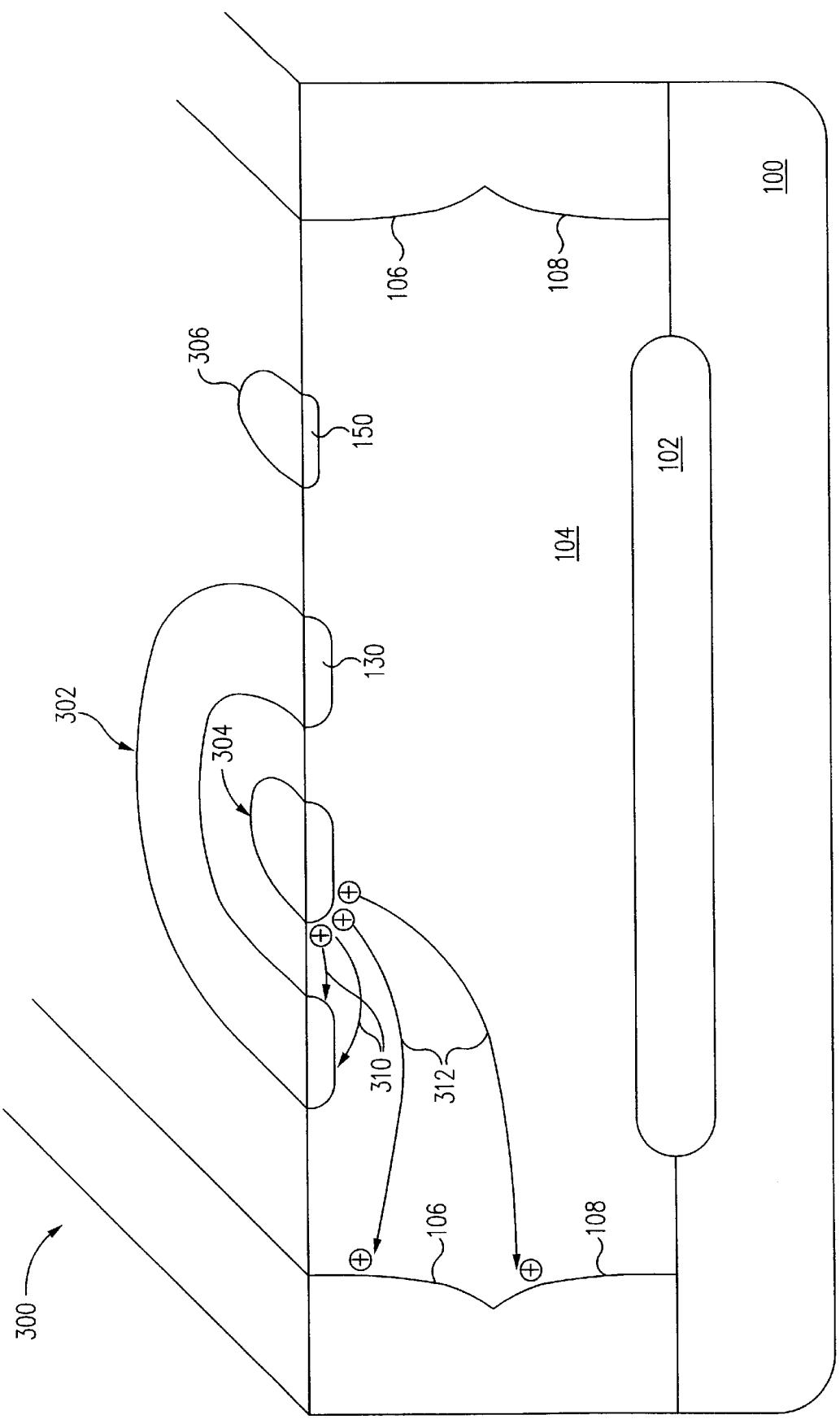
FIG. 3, labeled prior art, is a combination cross-section and top view of a well-known structure forming a lateral PNP transistor.

The repeatability of such a lateral PNP device is due in large part to the fact that the P-type deep base structure (here used to fabricate the collector) and P-type shallow base (here used to fabricate the emitter) are self-aligned to each other, using the same hard oxide mask. This provides good control of the base width of the lateral PNP transistor. Because the collector of the lateral PNP device is implemented using a deep base region, the collection efficiency is increased and the substrate current injection (resulting from the parasitic hole current to the isolation and the substrate) is reduced. For example, a lateral PNP device 300 is illustrated in FIG. 3 which is fabricated using an identical implant (shown here using the shallow base implant 130) for both the collector 302 and the emitter 304. An N+ diffusion layer 306 contacts to the base of the lateral PNP transistor 300 by forming an "emitter" layer 150 (as described above) within the N-type epitaxial layer 104.

Injected holes from the emitter 304 are shown in several trajectories through the base region. Those labeled 310 are collected by the collector node and thus constitute desirable collector current, $I_C$, while those labeled 312 are instead collected by the junction isolation regions 106, 108 are constitute parasitic substrate current, $I_S$, which decreases the gain of the device. The ratio of substrate current to collector current ($I_S/I_C$) for such a transistor 300 may easily be 5%. For a similar lateral PNP device (e.g., transistor 200 shown in FIG. 2) fabricated using both the shallow base implant and deep base implant for the collector (in accordance with the exemplary process flow described above), the ratio of substrate current to collector current improves to 0.5%.

Referring now to FIG. 4, a lateral PNP transistor 400 is shown, which uses a single, deep implanted layer 410 to form the collector 402 (protecting the emitter window during the implantation operation with, for example, photoresist), and a single shallower implanted layer 412 to form the emitter 404 (protecting the collector window during the implantation operation). As before, both implants are aligned to windows in the dielectric layer 110, and a base contact 406 is formed by well known techniques to the epitaxial layer 104.

Capacitors (not shown) may also be formed, if desired, using the composite oxide layer 112 as the dielectric, a base region (either deep or shallow) as the lower capacitor plate, and a polysilicon feature as the upper capacitor plate. The desired breakdown voltage of the capacitors may be used to determine a suitable thickness for the composite oxide layer 112.

Although only a single example of each of several devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, including implant doses and energies, materials, and dimensions, including junction depths and layer thicknesses, are given by way of example only and can be varied to achieve the desired structures as well as modifications which are within the scope of the invention.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, the invention is not necessarily limited to any particular transistor polarity, or to any particular layer thickness or composition. Both vertical and lateral NPN transistors may be fabricated by choosing substrate doping and implant dopants accordingly. Moreover, while various dielectric layers described above are commonly formed of silicon dioxide (herein called "oxide"), such dielectric layers in the above embodiments may be formed of a silicon oxynitride, a silicon nitride, or any other suitable insulating material which may be formed in an appropriate thickness. A boron implant step may utilize B, BF, $BF_2$, or any other source containing boron atoms, and any phosphorus implant step described may utilize any source containing phosphorus atoms. Accordingly, other embodiments, variations, and improvements not described herein are not necessarily excluded from the scope of the invention, which is defined by the following appended claims.

What is claimed is:

1. A semiconductor integrated circuit structure including first and second vertical bipolar junction transistors, said structure comprising:

a semiconductor substrate of a first polarity having a top surface;

a first dielectric layer upon the top surface of the substrate, having first and second openings therethrough respectively corresponding to the first and second transistors;

a first doped layer at the top surface of and within the substrate, comprising a first dopant of a second polarity opposite that of the first polarity, and being formed generally below and substantially aligned to the first opening within the first dielectric layer;

a second doped layer at the top surface of and within the substrate, comprising a second dopant of the second polarity, and being formed generally below and substantially aligned to both the first and the second openings within the first dielectric layer, wherein the first doped layer is formed generally below and substantially aligned to the first opening but not the second opening, and the second doped layer has a depth which is substantially less than that of the first doped layer.

2. A semiconductor integrated circuit structure including first and second vertical bipolar junction transistors, said structure comprising:

a semiconductor substrate of a first polarity having a top surface, respective isolated regions of said substrate forming respective collector nodes for the first and second vertical bipolar junction transistors;

a first base region formed within the substrate and substantially aligned to a first opening through a first dielectric layer overlying the first base region, said first base region corresponding to the first vertical bipolar junction transistor and comprising a first doping profile of a second polarity opposite the first polarity, and a second doping profile of the second polarity; and a second base region formed within the substrate and substantially aligned to a second opening through the first dielectric layer overlying the second base region, said second base region corresponding to the second vertical bipolar junction transistor and comprising the second doping profile of the second polarity and not the first doping profile.

3. A structure as recited in claim 2 wherein:

the second doping profile has a depth which is substantially less than that of the first doping profile.

4. A structure as recited in claim 2 further comprising:

a first emitter region formed within the first base region at the surface of the substrate, said first emitter region comprising a third doping profile of the first polarity; and a second emitter region formed within the second base region at the surface of the substrate, said second emitter region comprising the third doping profile.

5. A semiconductor integrated circuit structure comprising:

a semiconductor substrate of a first polarity having a top surface, respective isolated regions of said substrate forming respective collector nodes for first and second vertical bipolar junction transistors;

a first base region formed within the substrate and substantially aligned to a first opening through a first dielectric layer overlying the first base region, said first base region corresponding to the first vertical bipolar junction transistor and comprising a first doping profile of a second polarity opposite the first polarity and a second doping profile of the second polarity, both the first and second doping profiles being substantially aligned to the first opening through the first dielectric layer;

a second base region formed within the substrate and substantially aligned to a second opening through the first dielectric layer overlying the second base region, said second base region corresponding to the second vertical bipolar junction transistor and comprising the second doping profile and not the first doping profile;

a first emitter region formed within the first base region at the surface of the substrate, said first emitter region comprising a third doping profile of the first polarity; and a second emitter region formed within the second base region at the surface of the substrate, said second emitter region comprising the third doping profile;

wherein the first doping profile has a depth which is substantially greater than that of the second doping profile.

6. A structure as recited in claim 5 wherein:

the first and second transistors respectively comprise a high-voltage bipolar junction transistor and a high-gain bipolar junction transistor.

7. A structure as recited in claim 5 wherein:

the first and second transistors respectively comprise bipolar junction transistors having different breakdown voltages.

8. A structure as recited in claim 5 wherein:

the first and second transistors respectively comprise bipolar junction transistors having different transistor gains.

9. A structure as recited in claim 5 wherein:

the first and second transistors respectively comprise bipolar junction transistors having different collector-to-base parasitic capacitances.

10. A structure as recited in claim 5 wherein:

the semiconductor substrate having a first polarity comprises an N-type substrate; and the first and second dopants comprise boron.

11. A structure as recited in claim 10 wherein:

the first doped layer is driven-in to achieve a final depth of approximately 6–7 microns; and the second doped layer is driven-in to achieve a final depth of approximately 3–4 microns.

12. A structure as recited in claim 10 wherein:

the substrate includes at its top surface an epitaxial layer approximately 28 microns thick.

13. A semiconductor integrated circuit structure comprising:

a semiconductor substrate of a first polarity having a top surface, respective isolated regions of said substrate forming respective collector nodes for first and second vertical bipolar junction transistors;

a first base region formed within the substrate and substantially aligned to a first opening through a first dielectric layer overlying the first base region, said first base region corresponding to the first vertical bipolar junction transistor and comprising a first doping profile of a second polarity opposite the first polarity and a second doping profile of the second polarity, both the first and second doping profiles being substantially aligned to the first opening through the first dielectric layer;

a second base region formed within the substrate and substantially aligned to a second opening through the first dielectric layer overlying the second base region, said second base region corresponding to the second vertical bipolar junction transistor and comprising the second doping profile;

a first emitter region formed within the first base region at the surface of the substrate, said first emitter region comprising a third doping profile of the first polarity;

a second emitter region formed within the second base region at the surface of the substrate, said second emitter region comprising the third doping profile; and a resistor region formed within the substrate and substantially aligned to a third opening through a first dielectric layer overlying the resistor region, said resistor region comprising a fourth doping profile of the second polarity, wherein the first doping profile has a depth which is substantially greater than that of the second doping profile.

14. A structure as recited in claim 13 wherein:

the first and second base regions further include a fourth doping profile of the second polarity formed therewithin and substantially aligned respectively to the first and second openings through the first dielectric layer respectively overlying the first and second base regions; and the fourth doping profile within the first and second base regions has a depth substantially less than that of the second doping profile.

15. The structure of claim 1, wherein the first plurality of doped layers have a doping concentration that is less than the doping concentration of the second plurality of doped layers.

16. The structure of claim 2, wherein the first doping profile has a doping concentration that is less than the doping concentration of the second doping profile.

17. The structure of claim 5, wherein the first doping profile has a doping concentration that is less than the doping concentration of the second doping profile.

* * * * *